(12) United States Patent
Yamazoe et al.

(10) Patent No.: US 9,508,581 B2
(45) Date of Patent: Nov. 29, 2016

(54) WAFER TRANSPORT ROBOT

(75) Inventors: Katsuhiro Yamazoe, Ibara (JP);
Shinichi Imai, Ibara (JP); Kosuke Sakata, Ibara (JP); Yoshiki Nishijima, Ibara (JP); Hiroaki Tsukimoto, Ibara (JP); Kohsaku Saino, Ibara (JP)

(73) Assignee: TAZMO CO., LTD., Okayama (JP)

( * ) Notice: Subject to any disclaimer, the term of this patent is extended or adjusted under 35 U.S.C. 154(b) by 287 days.

(21) Appl. No.: 14/365,431

(22) PCT Filed: Dec. 15, 2011

(86) PCT No.: PCT/JP2011/079030
§ 371 (c)(1),
(2), (4) Date: Jun. 13, 2014

(87) PCT Pub. No.: WO2013/088548
PCT Pub. Date: Jun. 20, 2013

(65) Prior Publication Data
US 2014/0321957 A1    Oct. 30, 2014

(51) Int. Cl.
*H01L 21/687* (2006.01)
*H01L 21/677* (2006.01)
*B25J 9/04* (2006.01)
*B25J 9/10* (2006.01)

(52) U.S. Cl.
CPC .......... *H01L 21/67742* (2013.01); *B25J 9/043* (2013.01); *B25J 9/1065* (2013.01)

(58) Field of Classification Search
CPC .. H01L 21/67742; B25J 9/043; B25J 9/1065
See application file for complete search history.

(56) References Cited

U.S. PATENT DOCUMENTS 6,450,757 B1 * 9/2002 Saeki .................... B25J 9/1065
414/744.5

FOREIGN PATENT DOCUMENTS

| JP | 06-042602 A | 2/1994 |
| JP | 2000-150617 A | 5/2000 |
| WO | WO 2008/059815 A1 | 5/2008 |

OTHER PUBLICATIONS

International Search Report for corresponding International Application No. PCT/JP2011/079030 mailed Feb. 28, 2012.

* cited by examiner

*Primary Examiner* — Scott Lowe
(74) *Attorney, Agent, or Firm* — Renner, Otto, Boisselle & Sklar, LLP

(57) ABSTRACT

An object is to transmit an operation of a first parallel link to a second parallel link through a plurality of rotatably supported arms, to prevent the second parallel link from meandering or rolling so that a wafer can be transported smoothly.
Arms (61 to 63) of a transmission arm unit (6) are provided for transmitting an operation of a first parallel link (4) to a second parallel link (5). An operation of the first parallel link (4) is transmitted to the second parallel link (5) so that an angle between an arm (53) and an arm (52) in the second parallel link(5) always coincides with an angle between an arm (41) and an arm (42) in the first parallel arm unit (4).

2 Claims, 3 Drawing Sheets

WAFER TRANSPORT ROBOT

TECHNICAL FIELD

The present invention relates to a horizontal articulated wafer transport robot applied to a semiconductor manufacturing apparatus for transporting a wafer.

BACKGROUND ART

As a horizontal articulated wafer transport robot used for transporting a wafer in semiconductor manufacturing, a robot having first and second parallel links is known. In a conventional wafer transport robot, a double link mechanism is configured by sharing one of four arms constituting a first parallel link as a common arm with a second parallel link to transmit an operation of the first parallel link to the second parallel link symmetrically. The transmission of an operation from the first parallel link to the second parallel link is performed by meshing a gear fixed to an end of a drive arm in the first parallel link with a gear fixed to an end of a driven arm in the second parallel link.

In another conventional wafer transport robot, an operation of the first parallel link is transmitted to the second parallel link by rotation of a belt extending between a pulley fixed to an end of a drive arm in the first parallel link and a pulley fixed to an end of a driven arm in the second parallel link.

CITATION LIST

Patent Literature

[Patent Literature 1]
Japanese Patent Unexamined Publication No. 6-042602

SUMMARY OF INVENTION

Technical Problem

However, in the configuration performing the transmission of an operation from the first parallel link to the second parallel link by meshing a gear fixed to an end of the drive arm with a gear fixed to an end of the driven arm, the second parallel link causes a meandering or a rolling due to the backlash in the gear train. Also, in case of using the belt, the second parallel link causes a meandering or a rolling due to slips between the belt and the pulleys. As a result, in the convention horizontal articulated wafer transport robot, there is such a problem that a misalignment of the wafer or an interference of the wafer at its side surface is caused during wafer loading to or unloading from a cassette or a stage.

An object of the present invention is to provide a wafer transport robot that can smoothly transport a wafer without causing any meandering or rolling of the second parallel link by transmitting an operation of the first parallel link to the second parallel link through a plurality of arms which are supported in a rotatable manner.

Solution to Problem

A wafer transport robot according to the present invention includes a multi-shaft drive unit, a first parallel link, a second parallel link, a handling arm, and a plurality of transmission arms. The multi-shaft drive unit includes at least an inner shaft and an outer shaft which are disposed coaxially. The first parallel link is configured by first and second arms which have first ends fixed to the inner shaft and the outer shaft, respectively, and third and fourth arms which are arranged in parallel to the first and second arms, respectively. The second parallel link is configured by either one of the third and fourth arms shared as a common arm, a fifth arm parallel to the common arm, a sixth arm has both ends pivotally supported on respective first ends of the common arm and the fifth arm, and a seventh arm has both ends pivotally supported on respective second ends of the common arm and the fifth arm. The handling arm is fixed to the fifth arm to be in parallel to the common arm. The plurality of transmission arms are rotationally connected to each other. The plurality of transmission arms transmits an operation of the first arm or the second arm to a driven arm so that an angle between the driven arm and the common arm coincides with an angle between the first arm and the second arm, where the driven arm is one of the sixth arm and the seventh arm and pivotally supported on the first end of the common arm together with the first arm or the second arm.

According to this configuration, an operation of the first parallel link is transmitted to the second parallel link by rotations of the plurality of transmission arms. None of backlash and slip is caused during the transmission of an operation from the first parallel link to the second parallel link.

In this configuration, it is preferable to form the handling arm and the fifth arm integrally. In this manner, the number of components can be reduced, so that the configuration can be simplified.

Also, it is preferable that a drive arm is provided with an extended part extending outside the first parallel link from the first end of the common arm, and that the plurality of transmission arms are configured by first through third transmission arms, where the drive arm is one of the first arm and the second arm and is pivotally supported on the first end of the common arm together with the driven arm. The first transmission arm has a first end pivotally supported on an open end of the extended part, and has a second end pivotally supported on a first end of the second transmission arm. The second transmission arm has a second end pivotally supported on an intermediate portion of the common arm. The third transmission arm has a first end pivotally supported on an intermediate portion of the first transmission arm, and has a second end pivotally supported on an intermediate portion of the driven arm. A length of each of the first transmission arm and the third transmission arm is made equal to a length from the first end of the common arm to the position at which the second transmission arm is pivotally supported. A length of the second transmission arm is made equal to a length of the extended part.

An operation of the first parallel link can be smoothly transmitted to the second parallel link by the three transmission arms.

Further, the multi-shaft drive unit may include a middle shaft coaxial with the inner shaft and the outer shaft, and the wafer transport robot may include two sets of the first parallel link, the second parallel link, the handling arm and the plurality of transmission arms.

Advantageous Effects of Invention

According to the present invention, an operation of the first parallel link is transmitted to the second parallel link without causing any meandering or rolling in the second parallel link, so that a wafer can be transported smoothly.

DESCRIPTION OF EMBODIMENTS

Hereinafter, embodiments of wafer transport robot according to the present invention will be described with reference to the drawings.

Figure 1:
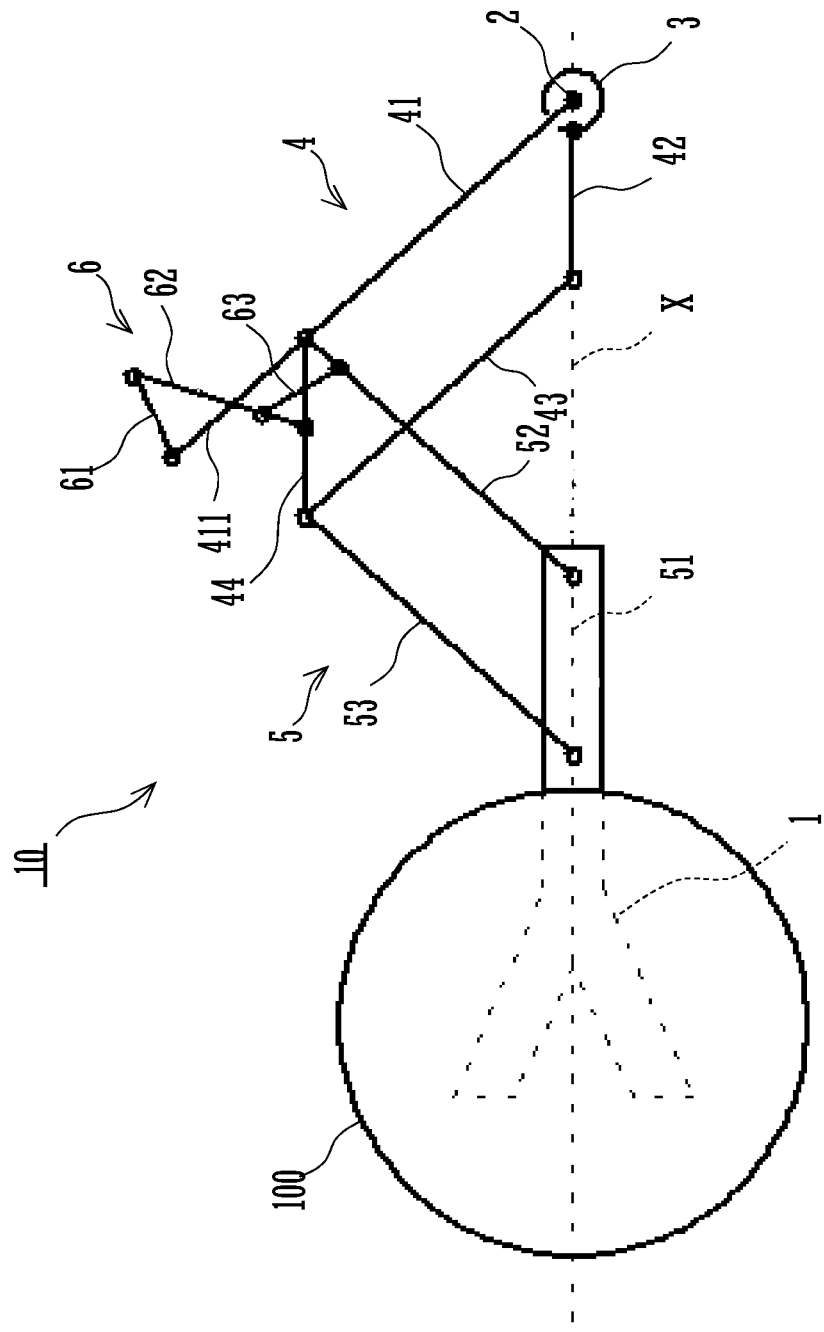
FIG. 1 is a schematic diagram showing a wafer transport robot according to a first embodiment of the present invention.

As shown in FIG. 1, a wafer transport robot 10 according to a first embodiment of the present invention places a wafer 100 on a handling arm 1, and transports the wafer 100 in a direction of an arrow X. The wafer transport robot 10 includes an inner shaft 2, an outer shaft 3, a first parallel link 4, a second parallel link 5, and a transmission arm unit 6.

The inner shaft 2 and the outer shaft 3, which are disposed coaxially to configure a multi-shaft drive unit of the present invention, are individually driven to rotate by motors not shown in the figure.

The first parallel link 4 is configured by first to fourth arms 41 to 44 which are pivotally supported at their ends by each other. One end of the first arm 41 is fixed to the inner shaft 2, and one end of the second arm 42 is fixed to the outer shaft 3. The third arm. 43 has the same inter-shaft length as that of the first arm 41, and is arranged in parallel to the first arm. 41. The fourth arm. 44 has the same inter-shaft length as that of the second arm 42, and is arranged in parallel to the second arm 42.

The second parallel link 5 is configured by fifth to seventh arms 51 to 53 and the fourth arm 44 which are pivotally supported at their ends by each other. The fourth arm 44 is a common arm shared by the first link 4 and the second link 5. The fifth arm 51 has the same inter-shaft length as that of the fourth arm 44, and is arranged in parallel to the fourth arm 44. The sixth arm 52 and the seventh arm 53 are the same in inter-shaft length, and arranged in parallel to each other.

The first arm 41, the third arm 43, the sixth arm 52 and the seventh arm 53 are the same in inter-shaft length. The second arm 42, the fourth arm 44 and the fifth arm 51 are the same in inter-shaft length. The second arm 42 and the seventh arm 53 are located on a straight line passing through the center of the inner shaft 2 and the outer shaft 3. In this arrangement, a horizontal articulated wafer transport robot is configured in a double-link structure with the first parallel link 4 and the second parallel link 5.

Incidentally, the fifth arm 51 is a part of the handling arm 1, and formed integrally with the handling arm 1. This makes it possible to reduce the number of components, and simplify the structure. The handling arm 1 may be formed separately from the fifth arm 51, and mounted to the fifth arm 51.

To move the wafer 100 placed on the handling arm 1 on the straight line X passing through the center of the inner shaft 2 and the outer shaft 3, it is necessary to move the second parallel link 5 in conjunction with the first parallel link 4. For this reason, the wafer transport robot 10 is provided with the transmission arm unit 6. The transmission arm unit 6 transmits an operation of the first parallel link 4 to the second parallel link 5.

The transmission arm unit 6, which corresponds to a plurality of transmission arms of the present invention, is configured by first to third transmission arms 61 to 63. A first end of the first transmission arm 61 is pivotally supported on an extended part 411 extending from the first arm 41. A second end of the first transmission arm 61 is pivotally supported on a first end of the second transmission arm 62. A second end of the second transmission arm 62 is pivotally supported on an intermediate portion of the fourth arm 44. Both ends of the third transmission arm 63 is pivotally supported on an intermediate portion of the second transmission arm 62 and an intermediate portion of the sixth arm 52, respectively.

Figure 2:
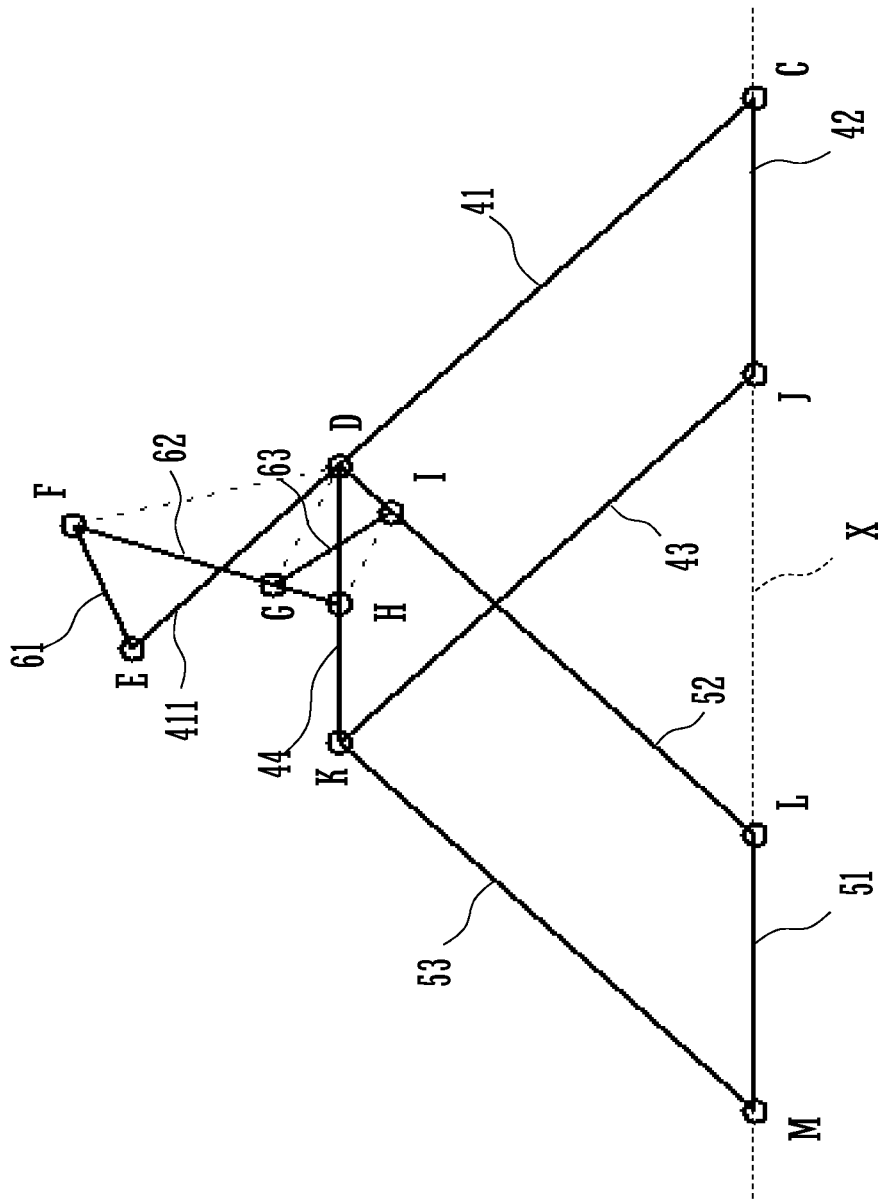
FIG. 2 is a schematic diagram for explaining an operation of a double-link structure provided in the wafer transport robot.

Assume, as shown in FIG. 2, that the first arm 41 be a side CD, the second arm 42 be a side CJ, the third arm 43 be a side JK, the fourth arm 44 be a side DK, the fifth arm 51 be a side ML, the sixth arm 52 be a side DL, the seventh arm 53 be a side KM, and the center of the inner shaft 2 and the outer shaft 3 be a point C. Assume also that the first transmission arm 61 be a side EF, the second transmission arm 62 be a side FH, and the third transmission arm 63 be a side GI.

Rotation of the inner shaft 2 causes a change in the angle $\angle JCD$ of the first parallel link 4 to change. Such a linkage operation that the angle $\angle LMK$ of the second parallel link 5 is always equal to the angle $\angle JCD$ allows the handling arm 1 to move on the line X.

Assume the length of each side be as $$DH=EF=GI \qquad \text{Formula 1}$$

$$DE=FH \qquad \text{Formula 2}$$

$$HG=DI=DH^2/FH \qquad \text{Formula 3.}$$

Since HG:DH=DH:FH from Formula 3, $\triangle HFD \backsim \triangle HDG$ holds.

Therefore, following formulae are obtained.

$$\angle HFD=\angle HDG \qquad \text{Formula 4}$$

$$\angle FDH=\angle DGH \qquad \text{Formula 5}$$

From Formula 1 and Formula 2, $\triangle HFD \equiv \triangle DF$ holds as all three corresponding sides are equal in length. Therefore, a following formula is obtained.

$$\angle HFD=\angle EDF \qquad \text{Formula 6}$$

From Formula 1 and Formula 3, $\triangle HDG \equiv \triangle IGD$ holds as all three corresponding sides are equal in length. Therefore, a following formula is obtained $$\angle IGD=\angle HDG \qquad \text{Formula 7}$$

From Formula 6 and Formula 7, a following formula is obtained.

$$\angle EDF=\angle IGD \qquad \text{Formula 8}$$

Here, the following relations hold:

$$\angle HDE=\angle FDH-\angle EDF \qquad \text{Formula 9}$$

$$\angle IGH=\angle DGH-\angle IGD \qquad \text{Formula 10.}$$

Therefore, from Formula 5, Formula 8, Formula 9 and Formula 10, a following formula is obtained.

$$\angle HDE=\angle IGH \qquad \text{Formula 11.}$$

Also, from Formula 1 and Formula 3, ΔIHD≡ΔHIG holds as all three corresponding sides are equal in length. Therefore, a following formula is obtained.

$$\angle IGH = \angle HDI \quad \text{Formula 12}$$

From Formula 11 and Formula 12, a following formula is obtained.

$$\angle HDE = \angle HDI \quad \text{Formula 13}$$

Here, the following relations hold:

$$\angle HDE = \angle JCD \quad \text{Formula 14}$$

$$\angle HDI = \angle LMK \quad \text{Formula 15.}$$

Therefore, from Formula 13, Formula 14 and Formula 15, a following formula is obtained.

$$\angle JCD = \angle LMK \quad \text{Formula 16}$$

This means that the handling arm 1 moves on the line X.

If the inner shaft 2 and the outer shaft 3 are simultaneously rotated in the same direction at a same angular velocity, the first parallel link 4 and the second parallel link 5 rotate integrally. If the outer shaft 3 is stopped and the inner shaft 2 is rotated, the angle ∠JCD of the first parallel link 4 changes, and, at the same time, the angle ∠LMK of the second parallel link 5 changes in the same manner, so that the handling arm 1 moves linearly. By combining these rotational operation and linear operation, it is possible to transport the wafer 100 placed on the handling arm 1 to a target position.

Figure 3:
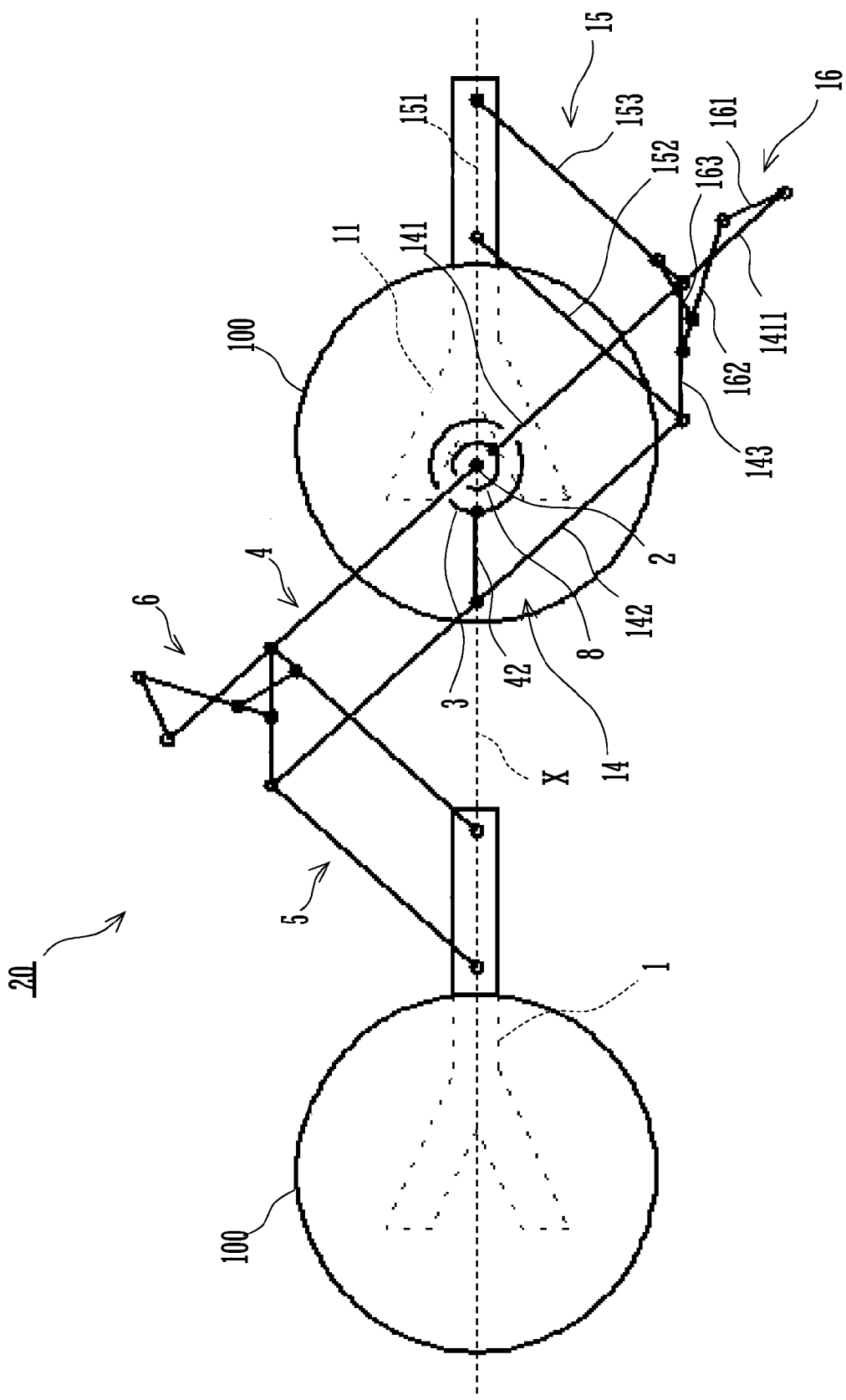
FIG. 3 is a schematic diagram showing a wafer transport robot according to a second embodiment of the present invention.

As shown in FIG. 3, a wafer transport robot 20 according to a second embodiment of the present invention is configured by adding a middle shaft 8, a handling arm 11, a third parallel link 14, a fourth parallel link 15, and a transmission arm unit 16 to the wafer transport robot 10. The middle shaft 8 is coaxially disposed between the inner shaft 2 and the outer shaft 3.

The third parallel link 14 is configured by pivotally supporting the second arm 42 and the eighth to tenth arms 141 to 143 by each other at their ends. One end of the eighth arm 141 is fixed to the middle shaft 8. The ninth arm 142 has the same inter-shaft length as that of the eighth arm 141, and is arranged in parallel to the eighth arm 141. The tenth arm 143 has the same inter-shaft length as that of the second arm 42, and is arranged in parallel to the second arm 42.

The fourth parallel link 15 is configured by pivotally supporting the eleventh to thirteenth arms 151 to 153 and the tenth arm 143 by each other at their ends. The tenth arm 143 is a common arm shared by the third parallel link 14 and the fourth parallel link 15. The eleventh arm 151 has the same inter-shaft length as that of the tenth arm 143, and is arranged in parallel to the tenth arm 143. The twelfth arm 152 and the thirteenth arm 153 are the same in inter-shaft length, and arranged in parallel to each other.

The eighth arm 141, the ninth arm 142, the twelfth arm 152 and the thirteenth arm 153 are made to be the same in inter-shaft length. The second arm 42, the tenth arm 143 and the eleventh arm 151 are made to be the same in inter-shaft length. The second arm 42 and the eleventh arm 151 are located on the line X passing through the center of the inner shaft 2, the outer shaft 3 and the middle shaft 8. In this arrangement, a horizontal articulated wafer transport robot is configured to have also a double-link structure with the third parallel link 14 and the fourth parallel link 151.

Incidentally, the eleventh arm 151 is a part of the handling arm 11, and formed integrally with the handling arm 11. This makes it possible to reduce the number of components, and simplify the structure. The handling arm 11 may be formed separately from the eleventh arm 151, and mounted on the eleventh arm 51.

The transmission arm unit 16 is configured by fourth to sixth transmission arms 161 to 163. A first end of the fourth transmission arm 161 is pivotally supported on an extended part 1411 extending from the eighth arm 141. A second end of the fourth transmission arm 161 is pivotally supported on a first end of the fifth transmission arm 162. A second end of the fifth transmission arm 162 is pivotally supported on an intermediate portion of the tenth arm 143. Both ends of the sixth transmission arm 163 are pivotally supported on an intermediate portion of the fifth transmission arm 162 and an intermediate portion of the thirteenth arm 153, respectively.

If the inner shaft 2, the outer shaft 3 and the middle shaft 8 are simultaneously rotated in a same direction at a same angular velocity, the first to fourth parallel links 4, 5, 14 and 15 rotate integrally. If the outer shaft 3 and the middle shaft 8 are stopped and the inner shaft 2 is rotated, the first parallel link 4 and the second parallel link 5 move linearly. If the outer shaft 3 and the inner shaft 2 are stopped and the middle shaft 8 is rotated, the third parallel link 14 and the fourth parallel link 15 move linearly. By combining these rotational operation and linear operations, it is possible to transport two wafers 100 placed on the handling arm 1 and the handling arm 11, respectively, to respective target positions. Since the wafer transport robot 20 simultaneously holds two wafers 100 in total on the handling arm 1 and the handling arm 11, processing efficiency of wafer transport is improved.

It should be understood that the embodiments described above are exemplifications in all respects, and are not limitative. Scope of the present invention is defined, not in the above-described embodiments, but in the accompanying claims. Further, it is intended that the scope of the present invention includes any modifications within the meaning and scope of the claims and equivalents thereof.

REFERENCE SIGNS LIST 1, 11 handling arm
2 inner shaft
3 outer shaft
4 first parallel link
5 second parallel link
6 transmission arm unit
8 middle shaft
10, 20 wafer transport robot
100 wafer

The invention claimed is:
1. A wafer transport robot comprising:
   a multi-shaft drive unit including an inner shaft, a middle shaft, and an outer shaft which are disposed coaxially;
   a first parallel link configured by first and second arms which have first ends fixed to the inner shaft and the outer shaft, respectively, and third and fourth arms which are arranged in parallel to the first and second arms, respectively;
   a second parallel link configured by the fourth arm shared with the first parallel link, a fifth arm parallel to the fourth arm, a sixth arm pivotally supported at both ends thereof on respective first ends of the fourth arm and the fifth arm, and a seventh arm pivotally supported at both ends thereof on respective second ends of the fourth arm and the fifth arm;
   a third parallel link configured by the second arm shared with the first parallel link, an eighth arm of which a first end is fixed to the middle shaft, a ninth arm arranged in parallel to the eighth arm, and a tenth arm arranged in parallel to the second arm;
a fourth parallel link configured by the tenth arm shared with the third parallel link, an eleventh arm parallel to the tenth arm, a twelfth arm pivotally supported at both ends thereof on respective first ends of the tenth arm and the eleventh arm, and a thirteenth arm pivotally supported at both ends thereof on respective second ends of the tenth arm and the eleventh arm;
two sets of handling arms respectively fixed to the fifth arm and the eleventh arm to be in parallel to the fourth arm and the tenth arm and each set of the handling arms for placing thereon a wafer;
a first transmission arm unit comprising:
  a first transmission arm of which a first end is pivotally supported on an extended part extending from the first arm;
  a second transmission arm of which a first end is pivotally supported on a second end of the first transmission arm and a second end is pivotally supported on an intermediate portion of the fourth arm; and
  a third transmission arm of which both ends are pivotally supported on an intermediate portion of the second transmission arm and an intermediate portion of the sixth arm, respectively; and
a second transmission arm unit comprising:
  a fourth transmission arm of which a first end is pivotally supported on an extended part extending from the eighth arm;
  a fifth transmission arm of which a first end is pivotally supported on a second end of the fourth transmission arm and a second end is pivotally supported on an intermediate portion of the tenth arm; and
  a sixth transmission arm of which both ends are pivotally supported on an intermediate portion of the fifth transmission arm and an intermediate portion of the thirteenth arm, respectively.

2. The wafer transport robot according to claim 1, wherein the two sets of handling arms are respectively formed integrally with the fifth arm and the eleventh arm.

* * * * *